United States Patent
Lee et al.

(10) Patent No.: US 10,461,282 B2
(45) Date of Patent: Oct. 29, 2019

(54) METHOD FOR DEPOSITING PROTECTION FILM OF LIGHT-EMITTING ELEMENT

(71) Applicant: TES CO., LTD, Yongin, Gyeonggi-do (KR)

(72) Inventors: Hong-Jae Lee, Gyeonggi-do (KR); Jong-Hwan Kim, Chungcheongnam-do (KR); Woo-Pil Shim, Gyeonggi-do (KR); Woo-Jin Lee, Busan (KR); Sung-Yean Yoon, Gyeonggi-do (KR); Don-Hee Lee, Gyeonggi-do (KR)

(73) Assignee: TES CO., LTD, Yongin, Gyeonggi-do (KR)

( * ) Notice: Subject to any disclaimer, the term of this patent is extended or adjusted under 35 U.S.C. 154(b) by 0 days.

(21) Appl. No.: 16/189,452

(22) Filed: Nov. 13, 2018

(65) Prior Publication Data

US 2019/0081283 A1    Mar. 14, 2019

Related U.S. Application Data

(63) Continuation of application No. PCT/KR2017/005042, filed on May 16, 2017.

(30) Foreign Application Priority Data

May 17, 2016 (KR) .......................... 10-2016-0059944

(51) Int. Cl.
 *H01L 51/40* (2006.01)
 *H01L 51/56* (2006.01)
 (Continued)

(52) U.S. Cl.
 CPC .......... *H01L 51/56* (2013.01); *H01L 21/022* (2013.01); *H01L 21/0228* (2013.01);
 (Continued)

(58) Field of Classification Search
 CPC ..... H01L 51/56; H01L 51/5256; H01L 21/02; H01L 51/52; H01L 21/0228;
 (Continued)

(56) References Cited

U.S. PATENT DOCUMENTS

2012/0241811 A1* 9/2012 Kim ............... H01L 51/5253
                                                     257/100
2016/0336542 A1* 11/2016 Chen ............. H01L 21/67167

FOREIGN PATENT DOCUMENTS

KR    10-2012-0109083 A    10/2012
KR    10-2013-0117510 A    10/2013
 (Continued)

OTHER PUBLICATIONS

Taiwan Office Action for Taiwan Patent Application No. 106116035 by Taiwanese Intellectual Property Office, dated Oct. 3, 2017, with English translation, 5 pages.
 (Continued)

*Primary Examiner* — Vu A Vu
(74) *Attorney, Agent, or Firm* — Mintz Levin Cohn Ferris Glovsky and Popeo, P.C.; Kongsik Kim; Jhongwoo Jay Peck

(57) ABSTRACT

The present invention relates to a method of depositing a protection film for a light-emitting element, the method comprising the steps of: depositing a first inorganic protection layer on a light-emitting element on a substrate; and depositing a second inorganic protection layer, having comparatively smaller internal stress than the first inorganic protection layer, on the first inorganic protection layer.

10 Claims, 6 Drawing Sheets

(51) Int. Cl.
*H01L 51/52* (2006.01)
*H01L 21/02* (2006.01)

(52) U.S. Cl.
CPC .. *H01L 21/02126* (2013.01); *H01L 21/02178* (2013.01); *H01L 21/02274* (2013.01); *H01L 51/5256* (2013.01)

(58) Field of Classification Search
CPC ............ H01L 21/02274; H01L 21/022; H01L 21/02126; H01L 21/02178
USPC .......................................................... 438/99
See application file for complete search history.

(56) References Cited

FOREIGN PATENT DOCUMENTS

| | | | |
|---|---|---|---|
| KR | 10-2014-0087470 A | 7/2014 | |
| KR | 10-2014-0140524 A | 12/2014 | |
| KR | 10-2015-0049990 A | 5/2015 | |
| TW | 201438314 A | 10/2014 | |

OTHER PUBLICATIONS

First Office Action for Korean Patent Application No. 10-2016-0059944, by Korean Intellectual Property Office, English translation, 9 pages.

Final Rejection for Korean Patent Application No. 10-2016-0059944 by the Korean Intellectual Property Office, dated Jun. 26, 2017, English translation, 5 pages.

International Search Report for International Patent Application No. PCT/KR2017/005042, dated Aug. 11, 2017, English translation, 5 pages.

\* cited by examiner (A) (B)

METHOD FOR DEPOSITING PROTECTION FILM OF LIGHT-EMITTING ELEMENT

CROSS-REFERENCE TO RELATED APPLICATIONS

This application is a continuation application of International Application No. PCT/KR2017/005042 filed on May 16, 2017, which claims priority to Korean Application No. 10-2016-0059944 filed on May 17, 2016. The applications are incorporated herein by reference.

TECHNICAL FIELD

The present invention relates to a method of depositing a protection film of a light emitting diode (LED), and more particularly, a method of depositing a protection film, for continuously performing deposition procedures in one chamber when multi-layered inorganic protection film is deposited on a surface of a light emitting diode (LED) by atomic layer deposition (ALD), thereby increasing throughput compared with the prior art.

BACKGROUND ART

Recently, with development of the information age, research has been actively conducted into a display device and, in particular, a light emitting diode (LED) display or an organic light emitting diode (OLED) has drawn attention.

Such an OLED uses an organic material that autonomously emits light and has distinctly different characteristics from a conventional liquid crystal display (LCD), a plasma display panel (PDP), or the like. In particular, a display device using an OLED is a next-generation display device and is known as a so-called bendable display and, recently, has also been widely used as a display of various portable devices such as a cellular phone, a smartphone, and a tablet personal computer (PC).

An OLED is a device that generates an electron-hole pair from an electron and a hole in a semiconductor and emits light through a recombination procedure of the electron-hole pair. Such an OLED is capable of expressing all the three primary colors of light at a relatively low driving voltage and is excellent to acquire high resolution and natural color. It may be possible to produce a large-sized display device with low expense and such a display device advantageously has bendable characteristics and high response speed However, the above-mentioned OLED has a structure including an organic thin film and an electrode and, thus, has a problem in that the OLED is rapidly degraded when external moisture, oxygen, or the like penetrates thereinto. To overcome the problem, the OLED essentially needs a protection film that blocks moisture and oxygen.

Recently, a method of forming a protection film formed of an organic material and an inorganic material as a multiple layer by atomic layer deposition (ALD) or plasma enhanced chemical vapor deposition (PECVD) has been developed.

The ALD advantageously has a low water vapor transmission rate (WVTR) but has a problem in that it is difficult to apply it to a large-sized substrate and, in particular, throughput is extremely low when multi-layered protection film is formed. In addition, a protection film formed by the PECVD has a problem in terms of flexible characteristics due to a very thick thickness.

In addition, since multiple layer structures formed of organic and inorganic materials are formed using different deposition methods for respective layers, a deposition chamber needs to be separately installed and, thus, installation costs and installation areas are highly consumed and, in particular, throughput is highly low.

SUMMARY

An object of the present invention is to provide a method of depositing a protection film, which provides an effect similarly to the prior art with a thin thickness compared with the prior art when a protection film is deposited by atomic layer deposition (ALD).

In addition, another object of the present invention provides a method of depositing a protection film, for depositing protection films by one apparatus when a multi-layered protection film is deposited.

The object of the present invention can be achieved by providing a method of depositing a protection film of a light emitting diode (LED), the method including depositing a first inorganic protection layer on an LED of a substrate; and depositing a second inorganic protection layer with smaller internal stress than the first inorganic protection layer on the first inorganic protection layer.

Here, the depositing of the first inorganic protection layer and the depositing of the second inorganic protection layer may include depositing an aluminum oxide (AlOx) layer by atomic layer deposition (ALD).

In this case, the depositing of the first inorganic protection layer and the depositing of the second inorganic protection layer may be continuously performed using the same source gas in one chamber and may use different reaction gases.

In detail, the depositing of the first inorganic protection layer may include supplying a compound including aluminum (Al) as source gas and supplying $N_2O$ as reaction gas, and the depositing of the second inorganic protection layer may include supplying a compound including Al as source gas and supplying $O_2$ as reaction gas.

A thickness of the second inorganic protection layer may be equal to or greater than a thickness of the first inorganic protection layer.

Furthermore, the depositing of the first inorganic protection layer and the depositing of the second inorganic protection layer may be repeatedly performed to form a multi-layered protection film. In this case, when the depositing of the first inorganic protection layer and the depositing of the second inorganic protection layer are repeatedly performed, the multi-layered protection film may have reduced internal stress upward from the LED. In this case, plasma power amount and a reaction gas supply amount may be relatively increased upward from the LED.

The method may further include depositing a buffer layer on the second inorganic protection layer. In this case, internal stress of the buffer layer may be relatively smaller than internal stress of the second inorganic protection layer. The buffer layer may be formed of silicon oxide including carbon deposited by plasma enhanced chemical vapor deposition (PECVD). In addition, the buffer layer may be deposited using any one selected from an organic precursor group consisting of hexamethyl-disiloxane (HMDSO), tetramethyl-disiloxane (TMDSO), hexaethyl-disilane (HEDS), hexachloro-disilane (HCDS), and bisdiethylamino-silane (BDEAS).

According to the aforementioned method of depositing a protection film, it may be possible to deposit a protection film that has a relatively thinner thickness compared with the prior art while having a similar effect to the prior art by depositing a multi-layered protection film formed of an aluminum oxide mixture by atomic layer deposition (ALD).

In addition, a first inorganic protection layer and a second inorganic protection layer may be deposited using the same source gas in the same apparatus and, thus, an installation area of a deposition apparatus may be remarkably reduced and a processing time may also be relatively reduced compared to the prior art.

DETAILED DESCRIPTION

Hereinafter, reference is made in detail to various embodiments, examples of which are illustrated in the accompanying drawings.

With regard to a structure of an organic light emitting diode (OLED), the OLED includes an injection-type thin film device manufactured with an emissive layer and a transport layer. Accordingly, the OLED is the same as an inorganic semiconductor in that it is a light-emitting diode using P-N junction, but is different from a P-N junction-type light emitting diode (LED) in that the P-N junction-type LED is controlled by recombination by injection of minority carriers at a junction interface while the OLED is configured in such a way that all carriers involved in emitting light are injected from an external electrode. That is, a carrier injection-type light-emitting diode requires an organic material by which a carrier is easily injected and moved.

Figure 1:
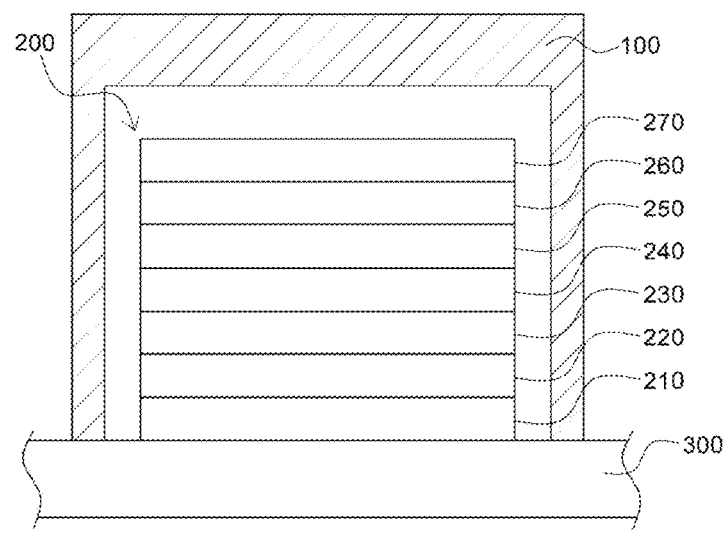
FIG. 1 is a schematic side cross-sectional view showing a structure of an organic light emitting diode (OLED).

FIG. 1 is a side cross-sectional view showing a structure of an OLED.

Referring to FIG. 1, an OLED 200 may include a stack structure including a substrate 300, an anode 210, a hole injection layer 220, a hole transport layer 230, an emissive layer 240, an electron transport layer 250, an electron injection layer 260, and a cathode 270 and may have a protection film 100 disposed above the OLED 200. The structure of the OLED 200 is well known to the art to which the present invention pertains and, thus, a detailed description thereof is omitted here.

As described above, an OLED includes a structure including an organic thin film and an electrode and, thus, has a problem in that the OLED is rapidly degraded when external moisture, oxygen, or the like penetrates thereinto and, accordingly, to overcome the problem, the OLED needs a protection film that blocks moisture and oxygen. In this case, the quality of the protection film may be slightly different depending on sensitivity with respect to a contamination factor. For example, in the case of an OLED, a protection film with $10^{-6}$ g/m$^2$·24 hours or less is required.

Recently, a method of forming a protection film formed of an inorganic material as a multiple layer using an atomic layer deposition (ALD) or plasma enhanced chemical vapor deposition (PECVD) apparatus has been used. However, ALD advantageously has a low water vapor transmission rate (WVTR) but has a problem in that it is difficult to apply it to a large-sized substrate and throughput is extremely low. Furthermore, a protection film formed by PECVD has a problem in that flexible characteristics are degraded due to a relatively very large thickness. In addition, when the protection film is deposited as a multiple layer, different layer are deposited and, thus, separate apparatuses for forming the respective layers are needed, thereby expanding manufacturing costs and further increasing manufacturing time.

Accordingly, the present invention proposes a method of depositing a protection film that has a relatively thin thickness, has a similar effect and, simultaneously, increases throughput and has a low WVTR value to the prior art. With reference to the drawings, the deposition method is now described.

Figure 2:
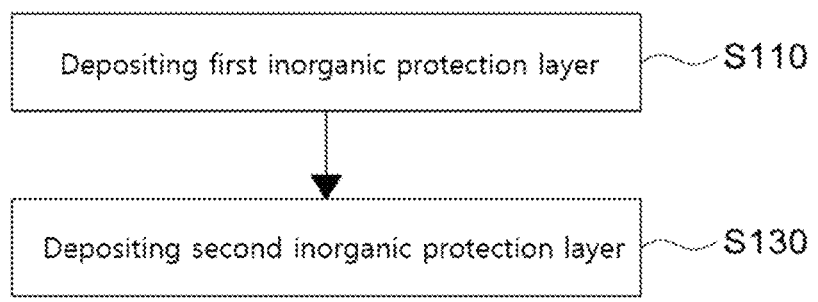
FIG. 2 is a flowchart showing a deposition procedure of a protection film according to the present invention.
Figure 3:
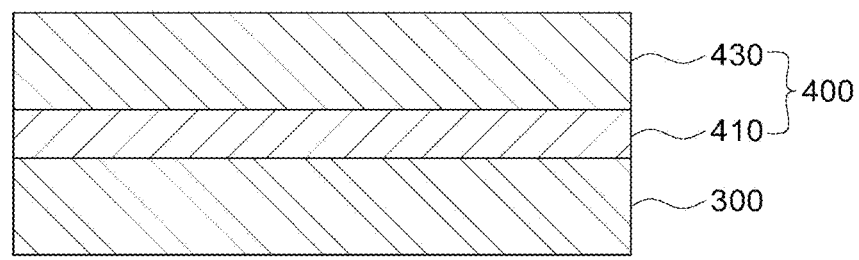
FIG. 3 is a cross-sectional view showing a protection film according to an exemplary embodiment of the present invention.

FIG. 2 is a flowchart showing a deposition procedure of a protection film according to the present invention. FIG. 3 is a cross-sectional view showing a protection film according to an exemplary embodiment of the present invention. In FIG. 3, for convenience, a light-emitting diode is omitted and a protection film is formed above a substrate.

Referring to FIGS. 2 and 3, the deposition procedure of the protection film of an LED according to the present invention may include depositing (S110) a first inorganic protection layer 410 on an LED 200 (refer to FIG. 1) disposed on the substrate 300 and depositing (S130) a second inorganic protection layer 430 on the first inorganic protection layer 410. In this case, internal stress of the second inorganic protection layer 430 may be relatively smaller than internal stress of the first inorganic protection layer 410. That is, the internal stress of the first inorganic protection layer 410 deposited directly on an upper surface of the LED 200 may be greater than internal stress of the second inorganic protection layer 430. As seen from an experiment of the present applicant, when a multi-layered protection film is deposited on an upper surface of the LED 200, internal stress may be reduced upward from the upper surface of the LED 200, which is described below in detail.

According to the present invention, the first inorganic protection layer 410 and the second inorganic protection layer 430 may be formed of inorganic layers and may be deposited by ALD. In the present embodiment, a multi-layered protection film is deposited by ALD and, thus, an excellent step coverage effect may be achieved and a pin hole or the like, which may be formed in a deposition procedure of a protection film, may be effectively removed.

Here, the depositing of the first inorganic protection layer and the depositing of the second inorganic protection layer may be continuously performed in one chamber using the same source but may be performed using different reaction gases.

That is, according to the present embodiment, both the first inorganic protection layer 410 and the second inorganic protection layer 430 may be deposited by ALD using a compound including aluminum (Al), e.g., trimethylaluminum (TMA) as source gas and may be deposited using different reaction gases that react with the source gas. For example, in the depositing of the first inorganic protection layer 410, $N_2O$ gas may be supplied as reaction gas and, in the depositing of the second inorganic protection layer 430, $O_2$ gas may be supplied as reaction gas.

As such, when a protection film for an LED is deposited, a multi-layered protection film formed of an inorganic material may be deposited to prevent a pin hole, which may be formed during deposition of a protection film, from being grown. That is, the first inorganic protection layer 410 and the second inorganic protection layer 430 may be deposited using the same source gas, but the first inorganic protection layer 410 and the second inorganic protection layer 430 may be deposited using different reaction gases and, thus, may use different mechanisms for growing a thin film. Accordingly, the pin hole, which may be formed during deposition of the first inorganic protection layer 410, may not be grown any longer during deposition of the second inorganic protection layer 430 and, thus, a penetrating path of impurities through the pin hole may be expanded to a long distance to prevent impurities from penetrating thereinto.

In addition, the first inorganic protection layer 410 and the second inorganic protection layer 430 are deposited using one source gas and, thus, it may be possible to deposit both the first inorganic protection layer 410 and the second inorganic protection layer 430 in a single chamber and, furthermore, it may also be possible to supply different reaction gases to continuously perform the deposition procedure. Accordingly, a problem in terms of an increase in installation area, an increase in deposition procedure, a complicated apparatus configuration, and so on, which may occur when a separate deposition apparatus is required, may be overcome and, in particular, a time taken to deposit a multiple layer may be reduced to overcome low throughput, which is the most serious problem of ALD.

In the depositing of the first inorganic protection layer and the depositing of the second inorganic protection layer, an aluminum oxide mixture (AlOx) layer may be deposited by ALD, and more accurately, a close layer to $Al_2O_3$ may be deposited. In this case, the first inorganic protection layer 410 and the second inorganic protection layer 430 may be formed by depositing the same layer but may be deposited using different reaction gases, as described above, and thus, may have different film properties, for example, internal stress or a refractive index.

The first inorganic protection layer 410 is deposited directly on the upper surface of the LED 200 and, thus, it may be important to minimize damage of the LED 200 during deposition and, for this reason, when the first inorganic protection layer 410 is deposited, trimethylaluminum (TMA) may be used as source gas and $N_2O$ gas may be used as reaction gas for plasma generation. When radical is formed, energy for disconnecting chemical bond of gas molecule may be required. Comparing $N_2O$ gas and $O_2$ gas, oxidation reaction may occur using low energy in the case of $N_2O$ gas compared with $O_2$ gas. Therefore, damage of an LED may be reduced when $N_2O$ gas is used instead of $O_2$ gas.

For example, when the first inorganic protection layer 410 is deposited, pressure inside a chamber (not shown) in which a deposition procedure is performed may be about 0.40 to 0.80 Torr, a supply amount of TMA as source gas may be about 20 to 70 sccm, a supply amount of $N_2O$ as reaction gas may be about 50 to 200 sccm, a power supply amount for plasma generation may correspond to about 500 to 1500 W, and a supply amount of inert gas (Ar) for purge may correspond to about 4000 to 10000 sccm.

In this case, internal stress of the first inorganic protection layer 410 may have a range of about −400 MPa to +400 MPa and a refractive index of the first inorganic protection layer 410 may have a value between 1.50 and 1.70.

The second inorganic protection layer 430 may use TMA as source gas and may use $O_2$ gas as reaction gas for plasma generation. For example, pressure inside a chamber (not shown) in which a deposition procedure is performed when the second inorganic protection layer 430 is deposited may be about 0.50 to 0.80 Torr, a supply amount of TMA as the source gas may be about 30 to 70 sccm, a supply amount of $O_2$ as reaction gas may be about 4000 to 10000 sccm, a power supply amount for plasma generation may correspond to about 1000 to 2000 W, and a supply amount of insert gas (Ar) for purge may correspond to about 4000 to 10000 sccm.

In this case, internal stress of the second inorganic protection layer 430 may have a range of about −100 Mpa to +100 MPa, and oxygen and moisture transmittance is equal to or less than $1 \times 10-3$ g/m²·day, and a refractive index is a value between 1.60 and 1.70.

In the aforementioned case, the first inorganic protection layer 410 and the second inorganic protection layer 430 may have different pressures, supply amount, and so on due to a difference in reaction gas. That is, the first inorganic protection layer 410 may acquire oxygen radical by plasma decomposition of $N_2O$ gas and the second inorganic protection layer 430 may acquire oxygen radical by plasma decomposition of $O_2$ gas.

In this case, decomposition energy and recombination energy may be different due to a difference in bond energy between $O_2$ molecules formed by covalent bond and $N_2O$ molecules formed by ionic bond and, accordingly, a difference in pressure and supply amount may be generated. For example, bond energy of $O_2$ molecules may be 498 kJ/mol and bond energy of $N_2O$ molecules that are a strong oxidizing agent may be 82 kJ/mol. Accordingly, when $N_2O$ is used as reaction gas, a large amount of oxygen radical may also be generated with low power to reduce damage of plasma on an LED. A process condition may be changed because of a difference in a generated amount of oxygen radical required in a final layer due to such a difference in reaction gas, a difference in decomposition energy of reaction gas, a difference in covalent bond and ionic bond, and a difference in recombination for stabilization.

Comparing internal stress of the first inorganic protection layer 410 and the second inorganic protection layer 430 among the above properties, internal stress of the first inorganic protection layer 410 deposited directly on the upper surface of the LED 200 is relatively higher than internal stress of the second inorganic protection layer 430, as described above. According to an experiment of the present applicant, when a multi-layered protection film is deposited on an upper surface of the LED 200, if internal stress is reduced upward from the upper surface of the LED 200, a protection film 400 of the LED may be firmly attached to the LED 200. On the other hand, when internal stress is increased upward from the upper surface of the LED 200, the LED 200 may peel off from a substrate by the protection film 400 of the LED. As a result, like in the present embodiment, when a multi-layered protection film formed of an inorganic layer is configured, internal stress of each protection film may be reduced upward from the upper surface of the LED 200.

Figure 4:
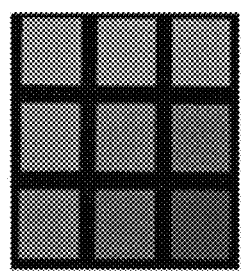
FIG. 4 is an image of an experimental result based on a difference in internal stress of inorganic protection layers deposited on a light emitting diode (LED).
Figure 4:
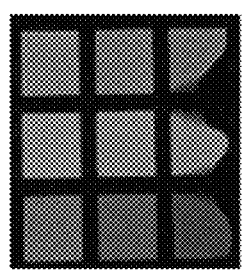

FIG. 4 is an image of an experimental result based on a difference in internal stress of a plurality of inorganic protection layers when the inorganic protection layers are deposited on a plurality of LEDs. The experiment is performed by evaluation of high-temperature and high-humidity reliability and, in this case, a high-temperature condition is 85° C. and a high-humidity condition is 85% RH.

In this case, FIG. 4A shows the case in which internal stress of a first inorganic protection layer positioned on an upper surface of an LED is relatively greater than internal stress of a second inorganic protection layer and, on the other hand, FIG. 4B shows the case in which internal stress of the second inorganic protection layer is relatively higher than internal stress of the first inorganic protection layer positioned on the upper surface of the LED.

Referring to FIG. 4, a passivation effect of a thin film is evaluated by evaluation of high-temperature and high-humidity reliability of an OLED and, as seen from FIG. 4A, a passivation effect is excellent without a change in an LED when the internal stress of the first inorganic protection layer positioned on the upper surface of the LED is relatively greater than the internal stress of the second inorganic protection layer.

On the other hand, as seen from FIG. 4B, an LED may shrink due to penetration of moisture, impurities, or the like when the internal stress of the second inorganic protection layer is relatively greater than the internal stress of the first inorganic protection layer positioned on the upper surface of the LED.

When an entire thickness of the protection film 400 of the LED is determined, comparing thickness of the first inorganic protection layer 410 and thickness of the second inorganic protection layer 430, the second inorganic protection layer 430 may be deposited to a thickness equal to or greater than the thickness of the first inorganic protection layer 410. That is, the protection film 400 of the LED may be firmly attached to the LED 200 by the first inorganic protection layer 410 with relatively great internal stress and, simultaneously, the second inorganic protection layer 430 with relatively low internal stress may be deposited to a thickness equal to or greater than the thickness of the first inorganic protection layer 410, thereby providing flexibility of the protection film 400 while maintaining the characteristics of the protection film 400.

Figure 5:
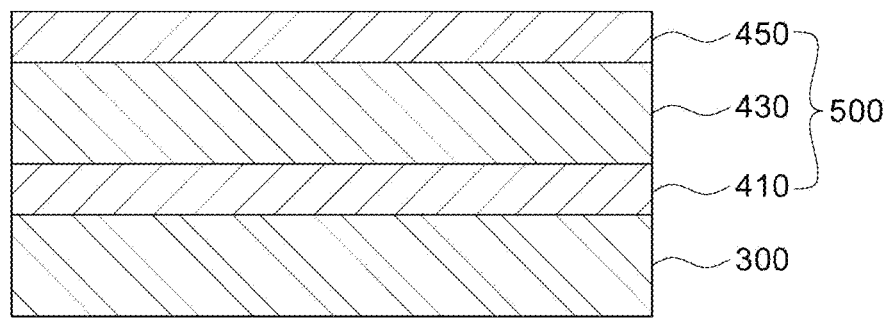
FIG. 5 is a cross-sectional view of a protection film according to another exemplary embodiment of the present invention.

FIG. 5 is a cross-sectional view of a protection film according to another exemplary embodiment of the present invention.

Referring to FIG. 5, a protection film 500 of a light-emitting diode according to the present embodiment is different from the aforementioned embodiment in that the protection film 500 further include a buffer layer 450 disposed above the second protection film 430. The deposition procedure may further include depositing the buffer layer 450 on the second protection layer 430 subsequently to deposition of the second protection layer 430.

The buffer layer 450 may be formed of silicon oxide (SiOC) containing carbon and may cover particles, which may be generated during deposition by PECVD, to prevent oxygen and moisture from penetrating and to alleviate defects generated on a surface and internal stress. In addition, the optical characteristics of the protection film 500 of the light-emitting diode may be enhanced by adjusting the refractive index and thickness of the buffer layer 450.

In detail, the buffer layer 450 may be deposited using any one selected from the organic precursor group consisting of hexamethyl-disiloxane (HMDSO), tetramethyl-disiloxane (TMDSO), hexaethyl-disilane (HEDS), hexachloro-disilane (HCDS), and bisdiethylamino-silane (BDEAS). Thin film stress of the buffer layer 450 may have a value of +50 Mpa from −50 Mpa and may have deposition rate equal to or greater than 250 nm/min.

In this case, internal stress of the buffer layer 450 may be relatively smaller than internal stress of the second inorganic protection layer 430. That is, as described above, in terms of attachment of the protection film, internal stress of the protection film may be reduced upward from the upper surface of the LED 200. Accordingly, when the first inorganic protection layer 410 is deposited on the upper surface of the LED 200, the second inorganic protection layer 430 is deposited on an upper surface of the first inorganic protection layer 410, and the buffer layer 450 is deposited on an upper surface of the second inorganic protection layer 430, internal stress of each of the layers may be configured to be reduced upward from the LED 200. That is, the first inorganic protection layer 410 deposited on the upper surface of the LED 200 may have the greatest internal stress, the buffer layer 450 positioned at the uppermost portion may have the smallest internal stress, and the second inorganic protection layer 430 may have relatively intermediate internal stress.

Figure 6:
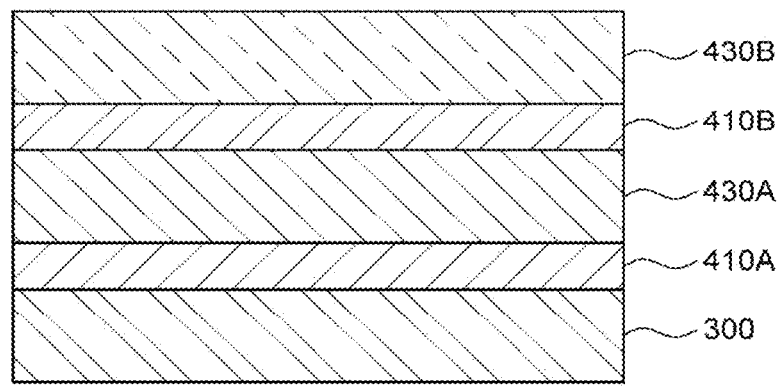
FIG. 6 is a cross-sectional view of a protection film according to another embodiment of the present invention.

FIG. 6 is a cross-sectional view of a protection film according to another embodiment of the present invention.

Referring to FIG. 6, with regard to the protection film according to the present embodiment, a multi-layered protection film may be deposited by repeatedly performing the depositing of the first protection film and the depositing of the second protection film.

Referring to FIG. 6, the protection film including a total of four layers may be formed by depositing a first inorganic protection layer 410A and a second inorganic protection layer 430A and, then, depositing a first inorganic protection layer 410B and a second inorganic protection layer 430B. Such repetitive processes may be performed an appropriate number of times. Although not illustrated, it may be possible to deposit the aforementioned buffer layer of the protection film illustrated in FIG. 5.

As described above, when the multi-layered protection film is formed by repeatedly performing the depositing of the first inorganic protection layer and the depositing of the second inorganic protection layer, the protection film may be deposited in such a way that internal stress may be relatively reduced upward from the LED 200. This is for firmly maintaining attachment between the protection film and the LED, as described above.

In the case of an aluminum oxide mixture (AlOx) layer formed by ALD, internal stress may be adjusted using plasma power amount and a reaction gas amount. In this case, the reaction gas may be changed to $O_2$ from $N_2O$ or to $N_2O$ from $O_2$.

[Table 1] below shows a change in internal stress depending on supplied power amount.

TABLE 1

| | Power (W) | Stress (Mpa) |
|---|---|---|
| 1 | 1000 | 229 |
| 2 | 1500 | 68 |
| 3 | 2000 | −104 |

As shown in [Table 1] above, a value of internal stress may be changed depending on supplied power amount and, for example, as power amount is increased, internal stress may be reduced.

[Table 2] below shows a change in internal stress depending on a reaction gas amount ($O_2$ gas amount).

TABLE 2

| | Reaction Gas Amount (sccm) | Stress (Mpa) |
|---|---|---|
| 1 | 4000 | 189 |
| 2 | 6000 | 142 |
| 3 | 8000 | 97 |

As shown in [Table 2] above, a value of internal stress may be changed depending on a supplied reaction gas amount and, for example, as a reaction gas amount is increased, internal stress may be reduced.

As described above, when the multi-layered protection film is formed by repeatedly performing the depositing of the first inorganic protection layer and the depositing of the second inorganic protection layer, total internal stress of the protection film may be adjusted by adjusting plasma power amount and a reaction gas amount.

As described above, it may be possible to adjust internal stress of each inorganic protection layer depending on plasma power amount and a reaction gas amount and, thus, the plasma power amount and the reaction gas amount may be adjusted to adjust total internal stress of the protection film, e.g., to adjust total internal stress of the protection film to a predetermined reference value or greater.

As a result, it may be possible to adjust internal stress of each inorganic protection layer by a combination of the plasma power amount and the reaction gas amount. Accordingly, when inorganic protection layers are stacked with two or more layers, the inorganic protection layers may be designed to be stacked in such a way that internal stress is reduced upward or a total internal stress value of an inorganic protection layer is less than a predetermined reference value.

While the present invention has been shown and described in connection with the preferred embodiments, it will be apparent to those skilled in the art that modifications and variations can be made without departing from the spirit and scope of the invention as defined by the appended claims. Accordingly, when the modifications and variations include the components of claims, they are within the technological scope of the present invention.

According to the present invention, it may be possible to deposit a protection film that has a relatively small thickness compared with the prior art while having a similar effect to the prior art by depositing a multi-layered protection film formed of an aluminum oxide mixture by atomic layer deposition (ALD).

In addition, a first inorganic protection layer and a second inorganic protection layer may be deposited using the same source gas in the same apparatus and, thus, an installation area of a deposition apparatus may be remarkably reduced and a processing time may also be relatively reduced compared to the prior art.

The invention claimed is:

1. A method of depositing a protection film for a light emitting diode (LED), the method comprising:
   depositing a first inorganic protection layer on an LED of a substrate; and
   depositing a second inorganic protection layer on the first inorganic protection layer, wherein internal stress of the second inorganic protection layer is smaller than internal stress of the first inorganic protection layer,
   wherein the depositing of the first inorganic protection layer and the depositing of the second inorganic protection layer comprise depositing an aluminum oxide (AlOx) layer by atomic layer deposition (ALD), and
   wherein the depositing of the first inorganic protection layer and the depositing of the second inorganic protection layer are continuously performed using the same source gas and different reaction gases in one chamber.

2. The method of claim 1, wherein the depositing of the first inorganic protection layer comprises supplying a compound including aluminum (Al) as source gas and supplying $N_2O$ as reaction gas; and
   wherein the depositing of the second inorganic protection layer comprises supplying a compound including Al as source gas and supplying $O_2$ as reaction gas.

3. The method of claim 2, wherein a thickness of the second inorganic protection layer is equal to or greater than a thickness of the first inorganic protection layer.

4. The method of claim 2, wherein the depositing of the first inorganic protection layer and the depositing of the second inorganic protection layer are repeatedly performed to deposit a multi-layered protection film.

5. The method of claim 4, wherein, when the depositing of the first inorganic protection layer and the depositing of the second inorganic protection layer are repeatedly performed, the multi-layered protection film has reduced internal stress upward from the LED.

6. The method of claim 5, wherein plasma power amount and a reaction gas supply amount are relatively increased upward from the LED.

7. The method of claim 1, further comprising depositing a buffer layer on the second inorganic protection layer.

8. The method of claim 7, wherein internal stress of the buffer layer is relatively smaller than internal stress of the second inorganic protection layer.

9. The method of claim 8, wherein the buffer layer is formed of silicon oxide including carbon deposited by plasma enhanced chemical vapor deposition (PECVD).

10. The method of claim 9, wherein the buffer layer is deposited using any one selected from an organic precursor group consisting of hexamethyl-disiloxane (HMDSO), tetramethyl-disiloxane (TMDSO), hexaethyl-disilane (HEDS), hexachloro-disilane (HCDS), and bisdiethyl-amino-silane (BDEAS).

* * * * *